(12) United States Patent
Anderson et al.

(10) Patent No.: US 6,201,392 B1
(45) Date of Patent: Mar. 13, 2001

(54) COPLANAR RF PROBE COIL ARRANGEMENT FOR MULTIFREQUENCY EXCITATION

(75) Inventors: Weston Anderson, Palo Alto; Richard S. Withers, Sunnyvale; Kevin A. Delin, Arcadia; Luis Felipe Fuks, Fremont; Wai Ha Wong, Cupertino, all of CA (US)

(73) Assignees: Varian, Inc.; Bruker Instruments, Inc., both of Palo Alto, CA (US)

( * ) Notice: Subject to any disclaimer, the term of this patent is extended or adjusted under 35 U.S.C. 154(b) by 0 days.

(21) Appl. No.: 08/965,735

(22) Filed: Nov. 7, 1997

(51) Int. Cl.[7] .................................................. G01V 3/00
(52) U.S. Cl. ............................................ 324/300; 324/318
(58) Field of Search ................................... 324/300, 307, 324/309, 312, 315, 318, 321, 322

(56) References Cited

U.S. PATENT DOCUMENTS

| | | | |
|---|---|---|---|
| 4,636,730 | 1/1987 | Bottomley | 324/318 |
| 5,389,880 | 2/1995 | Mori | 324/318 |
| 5,572,127 | * 11/1996 | Wong et al. | 324/315 |
| 5,585,723 | 12/1996 | Withers | 324/318 |
| 5,814,992 | * 9/1998 | Busse-Grawitz et al. | 324/318 |
| 5,951,474 | * 9/1999 | Matsunaga et al. | 324/318 |

FOREIGN PATENT DOCUMENTS

| | | |
|---|---|---|
| 0 175 129 A2 | 3/1986 | (EP) . |
| WO 84/00214 | 1/1984 | (WO) . |

OTHER PUBLICATIONS

Withers, et al., entitled "*HTS Receiver Coils For Magnetic–Resonance Instruments*", published in *SPIE*, Apr. 1994, vol. 2156, pp. 27–35.

Orlando and Delin, Addison Wesley Publishing Co., entitled "Foundations of Applied Superconductivity", 1990, Chap's 6 and 7, pp. 259–391.

Article by Michael Burl et al., entitled "Examples of the Design of Screened and Shielded RF Receiver Coils", published in *Magnetic Resonance In Medicine*, in Aug. 1996 vol. 36, No. 2, pp. 326–330.

Article by Erik K. Insko et al., Multicoil Array for High Resolution Imaging of the Breast, published in *Magnetic Resonance In Medicine*, in May 1997 vol. 37, No. 5, pp. 778–784.

Article by Martin L. Banson et al., entitled "A Probe for Specimen Magnetic Resonance Microscopy", published in *Investigative Radiology*, on Feb. 1, 1992 vol. 27, No. 2, pp. 157–164.

* cited by examiner

*Primary Examiner*—Louis Arana
(74) *Attorney, Agent, or Firm*—Edward H Berkowitz

(57) ABSTRACT

The present invention provides apparatus for utilizing planar HTS probe coils in substantially coplanar coil sets, each set comprised of a plurality of coils, two such similar sets being positioned on opposite sides of the sample to form a plurality of coil pairs. The coil pairs may be used for excitation of the sample, for receiving the NMR response signal or for both. A feature of the invention is the ability afforded to adjust the coupling between coil pairs to a minimum value to thereby prevent interaction between coil pairs having simultaneously applied high power signals and weak NMR response signals.

67 Claims, 11 Drawing Sheets

SECT A-A

COPLANAR RF PROBE COIL ARRANGEMENT FOR MULTIFREQUENCY EXCITATION

FIELD OF THE INVENTION

This invention relates to the field of nuclear magnetic resonance apparatus and particularly to radio frequency (rf) probe structures utilizing high temperature superconducting coils.

BACKGROUND OF THE INVENTION

Nuclear magnetic resonance (NMR) spectrometers first became available in 1946. In 1950 observations of "shifted" resonances in nitrogen spectra by W. G. Proctor & F. C. Yu, *Phys. Rev.* 77, 717, (1950) stimulated efforts to improve the homogeneity and stability of magnets used in the experiments and led to the observation of chemically shifted resonances in proton spectra by J. T. Arnold, S. S. Dharmatti, and M. E. Packard, *Jour. Chem. Phys.* 19, 1608, (1951). This marked the beginning of high resolution NMR and its application as an analytical tool for chemistry, and sparked rapid growth in the development of NMR spectrometers. This development continues today at a pace limited only by the availability of relevant technology. Recent work is predicated upon improvements in rf probe performance incorporating receiver coils made from recently available high temperature superconducting (HTS) materials.

Nuclei of most isotopes of the elements have non-zero spin and exhibit gyromagnetic properties. They behave like microscopic spinning bar magnets and possess a coupled nuclear magnetic moment. In the absence of an externally applied magnetic field the nuclear moments of an ensemble of non-zero spin nuclei are randomly oriented in their atomic or molecular environment. When a static homogeneous magnetic field B is applied, the magnetic moments interact with the field and become oriented with respect to it. The spins are then said to be "polarized" by the field. Only certain orientations are allowed in accordance with well known quantum mechanical principles as described in "*Nuclear Magnetic Resonance—Principles and Theory*", R Kitamaru, eds. Elsevier Science Publishers, 1990, Chap 2, pp. 25–36. As a consequence of the interaction of the field with the nuclear spin system, the nuclear energy level splits into multiple discrete levels corresponding to the different allowed orientations. Nuclei with spin equal ½ are the most suitable and most frequently used for high resolution NMR experiments. For simplicity and without loss of generality with respect to this present work, spin equal ½ nuclei will be assumed hereinafter. The split into two energy levels, corresponds to magnetic quantum numbers +½ and −½ for a spin ½ nucleus. The separation of the energy levels is proportional to the intensity of the magnetic field at the nucleus and to a proportionality constant $\gamma$ called the magnetogyric ratio. In thermal equilibrium in the static field, a Boltzmann distribution of energies is maintained. There are more spins in the lower energy state than in the higher energy state. This difference is called the Boltzmann excess.

When an ensemble of nuclei are simultaneously subjected to both a static magnetic field and an appropriate rf magnetic field of frequency $\nu$ such that the energy of a quantum of radiation $h\nu$, where h is Planck's constant, is equal to the energy difference between the two spin energy levels, transitions can occur with equal probability from one state to the other. Due to the Boltzmann excess there is a net absorption of energy by the nucleus from the rf field. This transfer of energy is a necessary condition for obtaining a NMR signal.

In the aggregate, large ensembles of nuclei such as would be present in practical size samples obey the laws of classical dynamics. For convenience of visualization and ease of understanding, a classical vector model of the NMR phenomenon is hereinafter described.

With the static magnetic field applied, individual nuclei align themselves to the field, some with their microscopic magnetization vector substantially in the direction of the field, which is the low energy state corresponding to spin equal +½. Also, some nuclei align with their magnetization vector substantially in the direction opposite to the field, which is the high energy state corresponding to spin equal −½. In accordance with the Larmour Precession Theorem the individual nuclei precess about the direction of the field with an angular frequency $\omega_L = \gamma B$, where $\gamma$ is the aforementioned magnetogyric ratio for each of the isotopic species, and B is the local field at the nuclei. More nuclei align in the direction of the field than in the direction opposite to the field, the difference being equal to the Boltzmann excess. Therefore, collectively the ensemble of nuclei exhibits a net macroscopic nuclear magnetization vector in the direction of the applied polarizing field B.

To generate a NMR signal, rf excitation is applied to the sample by a rotating magnetic field in the plane perpendicular to the direction of the polarizing field thereby enabling a transfer of energy to the spin system. The rotating field is provided by an alternating current in an excitation coil having its axis of symmetry perpendicular to the direction of the polarizing field. A linear oscillating magnetic field is generated along the x- axis of the excitation coil as shown in FIG. 1*a*. The linear oscillating field can be decomposed into two counterrotating components, one of which, usually called the $B_1$ field, rotates in the direction of rotation of the aforementioned ensemble of nuclear spins, as shown in FIG. 1*b*. When the angular frequency $\omega$ of the two rotating magnetic field components 20 and 22 is equal to $\omega_L$, the angular frequency of precession of the ensemble of nuclei 23, a resonance condition exists and, as shown in FIG. 1*c*, the net magnetization vector 8 tilts away from the z-axis 24 which is the direction of the static polarizing field 12 and precesses about it. As the magnetization vector 8 precesses about the polarizing field, it intersects the turns of a receiver coil, thereby generating a NMR signal. At resonance the angular frequency $\omega$ in the vector description equals $2\pi\nu$, where $\nu$ is the frequency of excitation which produces transitions between spin states in the quantum description of the phenomenon.

The broad general utility of NMR as a tool for determining the chemical structure of compounds is due to the influence of the molecular environment on the local magnetic field at the nuclei. The local magnetic field at the nucleus of a particular nuclear species at a particular site in a molecule is the vector addition of the externally applied field, altered slightly by the magnetic influence of its molecular environment. By way of example, circulation of electrons about the nucleus caused by the applied field results in an induced field at the nucleus which in some instances opposes the applied field (diamagnetism), and in some instances augments it (paramagnetism). By way of further example the local field at the nucleus can be additionally modified, taking on multiple values or "splitting" due to interactions with other non-zero spin nuclei in the molecule. As discussed hereinafter, these two effects, known as "chemical shift" and "spin-spin coupling" respectively are major sources of the fine structure seen in NMR spectra as described in "*Introduction To NMR Spectroscopy*", R. Abrahms.; J Fisher, P. Loftus, pubs. J Wiley & Sons, 1993, chap. 2, pp. 13–33, chap. 3, pp. 34–53. NMR spectra which are characterized by resonance lines that are narrower than the shifts in resonance caused by chemical shift and spin-spin coupling are known as high resolution spectra and are primarily made possible by the application of an extremely homogeneous polarizing field.

An NMR spectrometer is comprised of: 1) a D.C. magnet which provides said stable homogeneous magnetic field for polarizing the spins, 2) an rf system which provides a suitable rf excitation signal, 3) a coil or a plurality of coils for coupling the rf excitation to the spins and for receiving the NMR response signal, 4) a detection system for detecting the NMR response signal, 5) a signal processing system for processing the detected NMR response signal, and 6) an output device for displaying the NMR signal. For high resolution NMR studies, the compound under investigation is usually dissolved in or mixed with a suitable solvent and is in liquid form contained in a sample tube which is typically 5 mm in diameter. The sample is held in a sample holder portion of a probe which positions it in the most homogeneous region in the magnetic field. The coil or coils for coupling the rf excitation to the sample and for detecting the NMR signal are mounted on the probe.

NMR is an inherently insensitive technique. Sensitivity is strictly defined in terms of the minimum concentration of a test material required to produce a signal that is just detectable above the level of noise. For practical purposes however, the signal to noise ratio, S/N, is generally considered a good measure of sensitivity and the terms sensitivity and S/N ratio will be used interchangeably hereinafter.

The NMR signal is small for two fundamental reasons and numerous practical considerations. The first fundamental reason is that the energy changes involved in NMR transitions are small, and the second is that the net absorption of energy by an ensemble of nuclei is proportional to only the excess in population of the lower of the two energy states involved in the transition (i.e. the Boltzmann excess), rather than the total population. Specifically, the ratio of the number of spins in the higher energy state to the number in the lower energy state is $(1-h\nu/kT)$ where k is the Boltzmann constant. Therefore this excess population is very small, a typical value being of the order of 1 part in $10^5$. Other reasons for the small signal include the need to use dilute solutions of the species being observed, either because of limited availability of sample material or to prevent spectra being complicated and rendered unreproducible by the effects of intermolecular coupling.

As further discussed hereinafter, the dominant source of noise which enters into the determination of sensitivity is generally thermal noise originating in the receiver coil of the spectrometer.

In early continuous wave (CW) spectrometers, sample resonances were excited one at a time by a continuous sweep of the rf excitation or static magnetic field.

In modern NMR spectrometers one or more high intensity rf excitation pulses of short duration are applied and the NMR response of the spin system to the excitation is received and recorded as the spin system relaxes back towards its equilibrium state. The receiver is off during the excitation pulse. Then when the transmitter is switched off, the receiver is switched on to record the NMR response. Since one is off when the other is on, the excitation and receive functions can time share the same coil. Alternately, separate coils can be used for excitation and reception. When the rf excitation is removed the magnetization vector relaxes and precesses about the static field. As it precesses and intersects the turns of the receiver coil, an NMR time domain response signal called a Free Induction Decay, FID, is generated. The terminology "Free Induction Decay" derives from the characterization of the signal as being induced by a magnetization vector "free" of the influence of the rf excitation, while it is "decaying" back to equilibrium. The time domain FID signal is then converted to a frequency domain spectrum, by means of a Fourier Transformation. Instruments operating in this manner are called Pulsed FT NMR Spectrometers.

In a pulsed FT spectrometer all frequencies in the spectral band of interest are excited simultaneously and the resulting FID, when Fourier transformed, yields a spectrum over the entire band of interest. The time for acquiring data in a pulsed spectrometer is therefore greatly reduced and as a consequence, time averaging of FID's from multiple scans can be done in a reasonable time prior to Fourier transformation of the data. This results in an improvement in the signal to noise ratio, S/N, on the order of the square root of the number of scans. Time averaging is one of many methods and techniques that are routinely used to improve the sensitivity of NMR spectrometers.

Continued improvement in sensitivity has been a constant objective in the development of NMR spectrometers. Increasing signal strength, reducing noise, and improving signal processing methods have all contributed. Many of the factors that influence the attainable signal to noise ratio are treated in "A Handbook of Nuclear Magnetic Resonance", R. Freeman, pubs, Longman Scientific & Technical, 1988, pp. 216–229 which is hereby incorporated herein by reference. As discussed hereinafter, the signal to noise ratio can be further improved by cooling the receiver coil to a very low temperature while maintaining the sample at or near room temperature to reduce Johnson noise.

The available signal is proportional to both the nuclear magnetization and to the resonance frequency. Since the nuclear magnetization is proportional to the resonance frequency, the available signal for a given species is proportional to the square of the resonance frequency. Noise considerations however reduce the dependence of sensitivity on the resonance frequency to $\omega^{3/2}$ Largely because of this strong dependence of sensitivity on frequency, the trend has been toward higher and higher magnetic field strength and correspondingly higher values of NMR frequencies. Most modern NMR spectrometers utilize superconducting magnets capable of providing fields as intense as 18 tesla which are homogeneous over suitable sample size volumes. 17.6 tesla corresponds to an NMR frequency of 750 Mhz for protons.

Most modern NMR spectrometers have three separate transmitter channels: one to provide for a conventional field-frequency lock system, a second to provide the signal for observing the nucleus under study, and a third to provide 2D and decoupling capability. A block diagram of a typical modern pulsed spectrometer is shown in FIG. 2.

The probe is a critical component in an NMR spectrometer. For a given static magnetic field strength and a given sample size, the performance of the probe defines the sensitivity of the spectrometer. An important consideration in probe design is the coupling efficiency $\zeta$ of the receiver coil to the sample. $\zeta$ is the ratio of effective inductance to total inductance of the receiver coil. Any portion of the inductance of the receiver coil that does not contribute towards the detection of the NMR signal, such as coil leads by way of example, results in a loss of sensitivity proportional to $\zeta^{1/2}$. Another important consideration is the quality factor Q of the receiver coil which affects sensitivity by a factor of $Q^{1/2}$ since signal voltage is proportional to Q and noise voltage is proportional to $Q^{1/2}$. Q represents the ratio of energy stored in the receiver coil resonant circuit to the energy dissipated through resistive losses in the circuit. Another important consideration in probe design is the receiver-coil filling factor $\xi$ which, for a fixed coil- volume, influences the signal strength and the sensitivity directly. In the simple case of a cylindrical coil with diameter $d_c$ wrapped around a cylindrical sample with diameter $d_s$, $\xi$ would be approximately $(d_s/d_c)^2$. $\xi$ is a measure of the energy stored in the transverse magnetic field coupling to the sample, compared to the total magnetic energy stored in the receiver coil resonant circuit. Filling factor $\xi$, coupling efficiency $\zeta$, and quality factor Q should all be as large as possible for maximum sensitivity.

In many cases it is desirable, to simultaneously irradiate an NMR sample with several rf fields, each with a different frequency, without strong interaction occurring between the circuits producing the irradiating fields and the circuits detecting the responses. It is known in the art that transmitter drive can be largely decoupled from receiver coils by positioning the transmitter and the receiver coils on the probe at right angles to each other. This so called quadrature-coil configuration minimizes flux coupling between the coils. By making the mutual inductance between the coils very small the coupling of the strong irradiating signal to the sensitive receiver circuit can be largely eliminated.

Modern spectrometers use superconducting magnets. The cylindrical sample is positioned coaxially with the D.C. magnet. The transmitter and receiver coils can be a saddle coil as shown in FIG. 3a or a split formed-wire coil as shown in FIG. 3b. Either are ordinarily shaped to couple closely to the sample while providing the required $B_1$ field orthogonal to the static field B. Using high temperature superconducting (ITS) materials, coils have been fabricated by depositing a thin layer of superconductor on a flat dielectric substrate 45. A pair of such coils forming a magnetically coupled system, a Helmholtz pair, are shown in FIG. 4a, placed on opposite sides of a sample is in the prior art. Also in the prior art, a second pair of similar HTS coils is shown positioned orthogonal to the first pair as shown in FIG. 4b to simultaneously provide a field-frequency lock signal. HTS coils can have high currents induced therein which can drive the coil normal and destroy the Q or significantly reduce the Q resulting in loss of detection sensitivity.

Best results are obtained with HTS coils when the superconductor is lattice matched to the substrate, i.e. grown epitaxially. The substrate 45 should be a thermally conductive material to facilitate cooling of the coil and should have low magnetic susceptibility to avoid degrading the homogeneity of the magnetic field. Acceptable substrate materials include sapphire, lanthanum aluminate, and magnesium oxide. A preferred HTS material is $YBa_2Cu_3O_{7-\delta}$(YBCO), which has a critical transition temperature $T_c$ of approximately 87° K. A coil made of this material is described in "HTS Receiver Coils For Magnetic Resonance Instruments", R. S. Withers, B. F. Cole, M E. Johansson, G. C. Liang, G. Zaharchuk, Proc. SPIE, 2156, 27–35, (1994).

For proper performance HTS coils must be maintained at a temperature significantly below their transition temperature $T_c$. Joule-Thomson and Gifford-McMahon closed cycle refrigerators are known which cool the coils to 25° K. The coils are thermally isolated from the samples in this equipment and the samples can be maintained at or near room temperature if desired.

High resolution NMR probes using HTS coils can provide higher sensitivity than probes with non-superconducting coils. For a given sample volume the sensitivity of a coil is proportional to $(\xi Q/T)^{1/2}$ where T is the coil temperature and $\xi$ and Q are the aforementioned filling factor and quality factor respectively. A superconducting coil may have a Q of 20,000 compared with 250 for a room temperature coil and can operate at 25° K. With the geometry appropriate for a 5 mm. sample tube, and allowing for the loss of filling factor required for thermal isolation of the sample from the coil, the potential sensitivity gain can approach a factor of 10.

Any of the aforementioned coil configurations can be used to provide excitation and to detect NMR responses at more than one frequency by tuning the probe coil circuit to resonate at more than one frequency. However, since inductive elements are used to provide the frequency separation, multiple tuning degrades performance of the probe compared to a single tuned probe because of the inevitable reduction in the aforementioned coupling coefficient $\zeta$. Combining the use of multiple tuning of probe coil circuits and orthogonal coil disposition, any of the aforementioned prior art probe arrangements can provide rf excitation and reception of NMR responses at several different frequencies. Disadvantages of the prior art probe when used in this way include the aforementioned reduction in sensitivity due to lower coupling coefficient as well as high cost of fabrication. Additionally it is difficult to perform adjustments to minimize mutual coupling between orthogonal pairs.

SUMMARY OF THE INVENTION

We have provided an improved high sensitivity rf probe for NMR spectrometers utilizing planar high temperature superconducting coils. Multiple coil pairs are used to provide for simultaneous multiresonance excitation including excitation for field-frequency lock, spin-spin decoupling and other signal enhancement and spectra simplification objectives. The coil pairs on the probe can all be superconductors, or alternatively some can be superconductors and others normal conductors. The planar coils comprising one half of each coil pair are either substantially coplanar or on closely spaced parallel planes, with individual coil pairs having either common axes of symmetry or different axes of symmetry that form a small angle with respect to the axes of symmetry of the other coil pairs. The symmetry axes of all coil pairs are arranged to intersect at the center of the sample region. An advantageous feature of the invention is the flexibility afforded to adjust the spacing between coils and coil pairs to obtain a net mutual coupling of zero or near zero between coil pairs.

An object of this invention is to provide a NMR probe with improved sensitivity.

Another object of this invention is to provide a high sensitivity NMR probe with a plurality of coil pairs for multifrequency excitation of a sample.

Another object of this invention is to provide a high sensitivity probe with a plurality of coil pairs wherein the net mutual coupling between coil pairs is zero or near zero.

Another object of this invention is to provide a high sensitivity probe with a plurality of coil pairs wherein a method is provided for adjusting the net mutual coupling between coil pairs to zero or near zero.

Another object of this invention is to provide a high sensitivity NMR probe which utilizes high temperature superconducting HTS coils made of a thin layer of HTS material deposited on a flat substrate.

Another object of this invention is to provide a high sensitivity NMR probe which utilizes a plurality of HTS coil pairs.

Another object of this invention is to provide a high sensitivity NMR probe which utilizes one HTS coil pair and a plurality of total coil pairs.

Another object of this invention is to provide a high sensitivity NMR probe which utilizes one or more HTS coil pairs wherein the temperature of the superconducting coils can be maintained suitably low as to retain their superconducting property while the sample temperature is maintained at or near room temperature.

BRIEF DESCRIPTION OF THE DRAWINGS

FIG. 1b is a vector diagram showing the counter rotating components of the linear oscillating field of FIG. 1a.

FIG. 4c is a section view A—A of FIG. 4a.

FIG. 6b is the equivalent circuit of the coil pairs in FIG. 6a.

DETAILED DESCRIPTION OF THE INVENTION

Figure 1A:
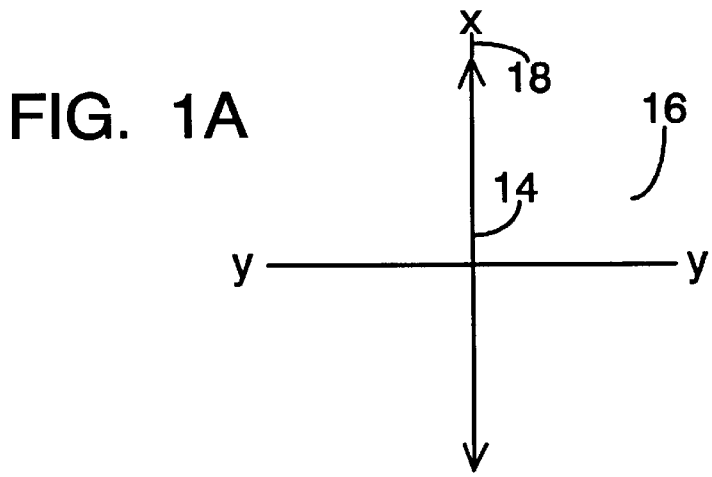
FIG. 1a is a vector diagram of a linear oscillating magnetic field.
Figure 1B:
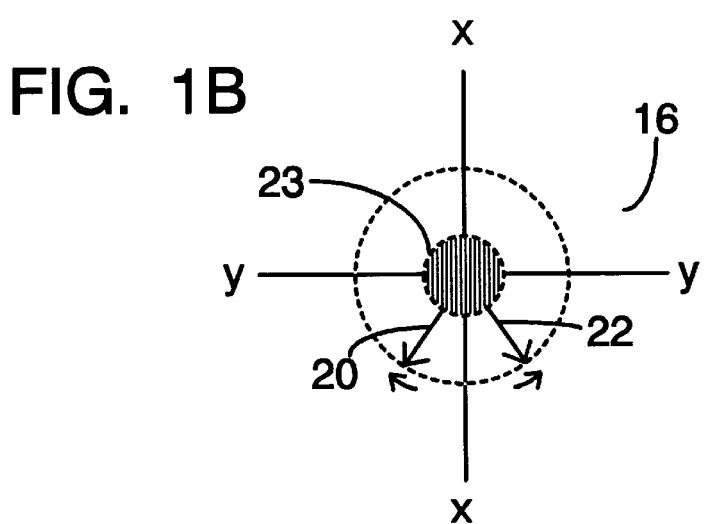
Figure 1C:
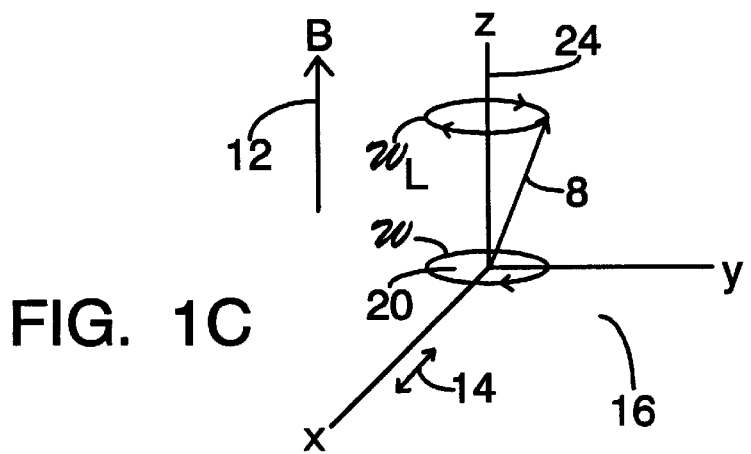
FIG. 1c is a vector diagram illustrating the nuclear magnetic resonance condition.

With reference to FIG. 1a, a linear oscillating rf magnetic field 14 is shown applied in the x-y plane 16 along the x axis 18. With reference to FIG. 1b, clockwise rotating component 20 and counter clockwise rotating component 22 of the linear oscillating magnetic field 14 are shown rotating about the z axis 24. The clockwise rotating component 20 is the rf $B_1$ excitation field. With reference to FIG. 1c, when the angular frequency ω of the excitation field 20 equals the Larmour frequency $ω^L$, the net magnetization vector 8 tilts away from the direction of the field 12 and simultaneously begins to precess about it. When the excitation field 20 is removed the magnetization vector 8 continues to precess about the field 12, generating a free induction decay signal in a receiver coil disposed with its axis or a projection of its axis of symmetry in the x-y plane 16.

Figure 2:
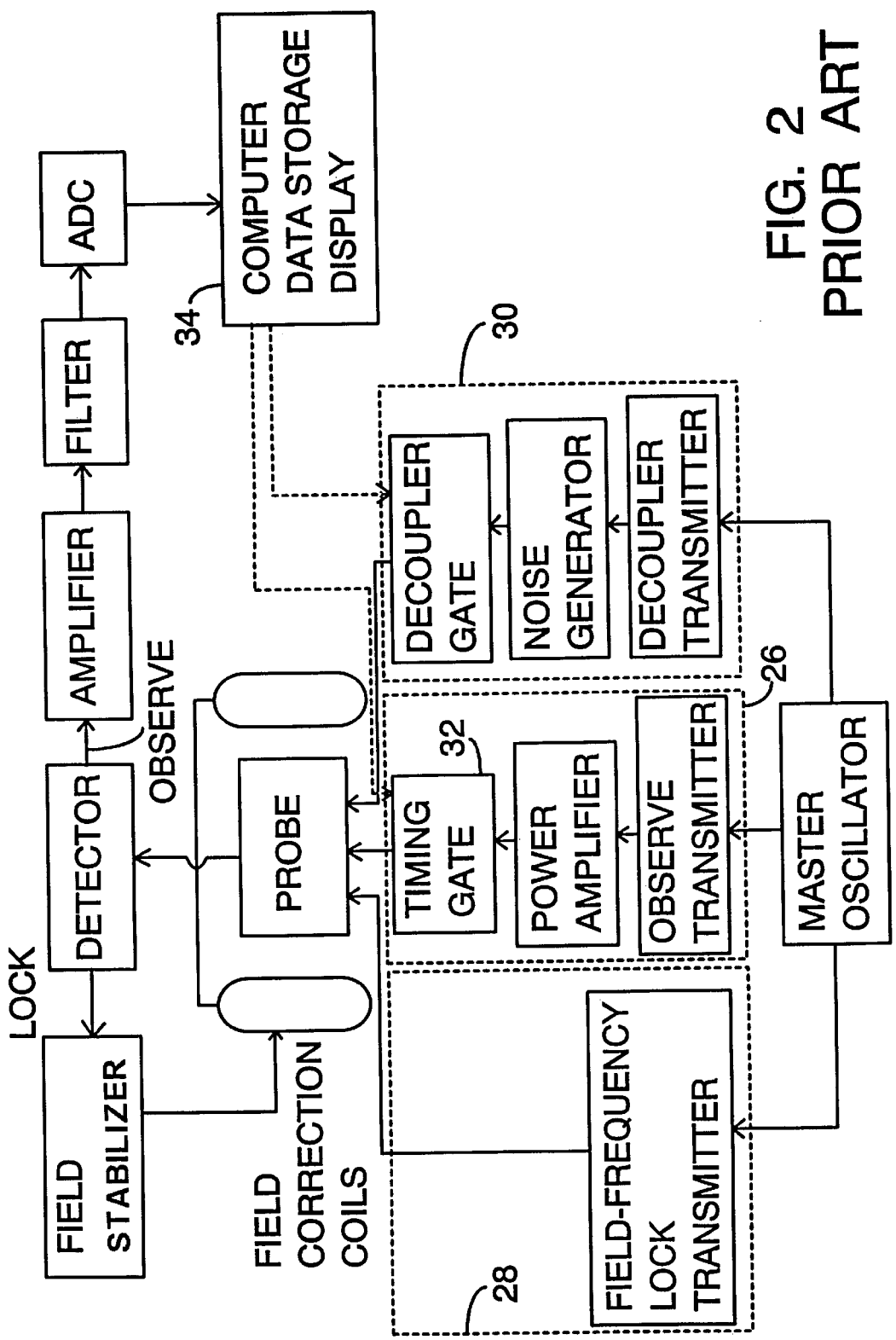
FIG. 2 is a block diagram of a Pulsed FT NMR Spectrometer.

With reference to FIG. 2, a block diagram of a modern Pulsed FT NMR Spectrometer is shown. Three separate transmitter channels provide for simultaneous multifrequency excitation to the probe, an observe channel 26, a field/frequency lock channel 28, and a decoupler channel 30. The field-frequency lock signal uses either a rapidly pulsed or a CW rf field. Other inputs to the probe are gated on and off by timing gates 32 under the control of computer 34.

Figure 3A:
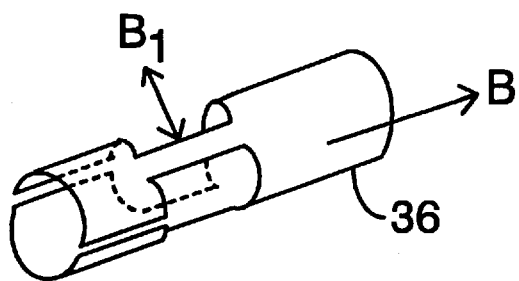
FIG. 3a shows a prior art saddle type probe.
Figure 3B:
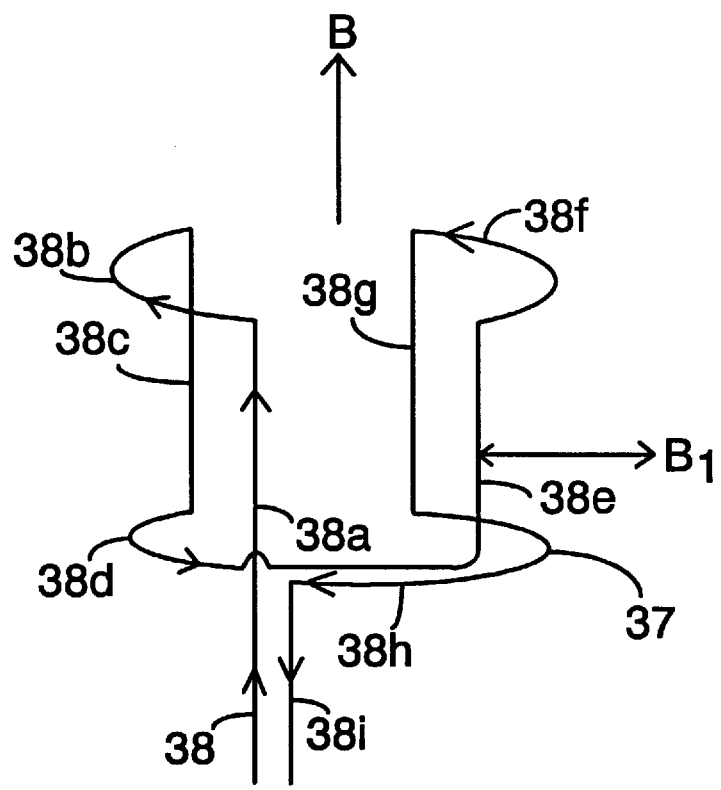
FIG. 3b shows a prior art split wire probe.

FIG. 3a shows a prior art saddle type probe coil 36 and FIG. 3b shows a prior art split formed-wire probe coil 37. Both are cylindrically shaped to maximize the filling factor for a cylindrical sample. Multiple frequency excitation can be provided with these probe coils by multiple tuning of the probe coil circuit, at the cost of reduced coupling efficiency. The parts of the coil are physically arranged so that the currents in the wires produce opposite canceling fields except for certain wires that aid. With respect to FIG. 3b, the field from current in 38 is largely canceled by the field from current in 38i. Similarly the field from current in 38b is canceled along the sample axis by the field from current in 38f. In contrast the field from current in 38a is aided by the field from current in 38e and the field from current in 38g is aided by the field from current in 38c. The direction of the fields remaining are illustrated by the vector $B_1$ arranged to be directed primarily parallel to the x-y plane and to pass through the center of the sample space. The coils on the opposite side,s of the sample space each define a magnetic field and the resultant field produced by the pair of coils defines a magnetic field having a symmetry plane which passes through the center of the sample space.

Figure 4A:
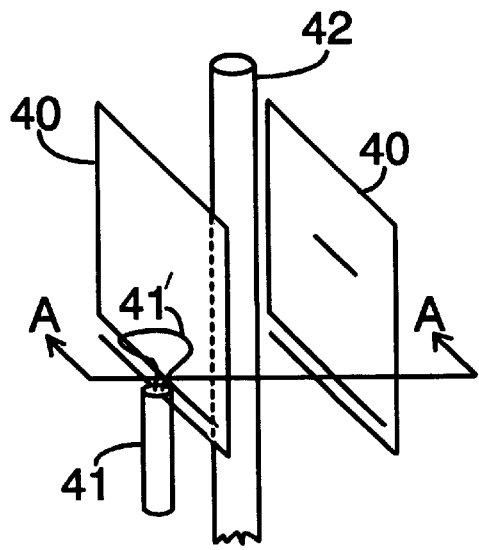
FIG. 4a is a schematic drawing of a pair of HTS coils with an input-output coupling loop.
Figure 4B:
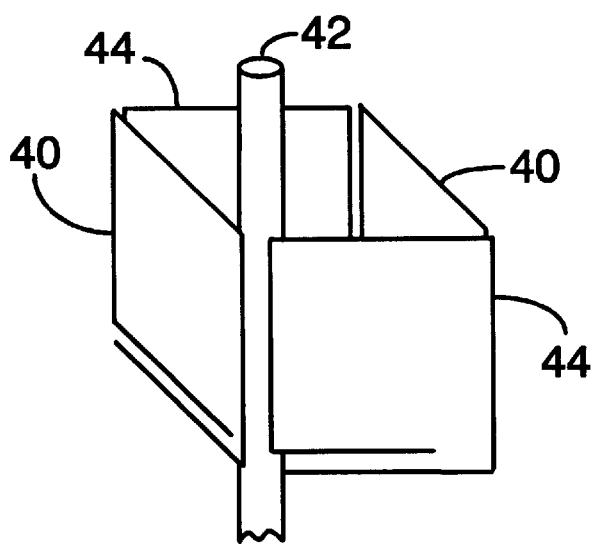
FIG. 4b is a schematic drawing of an orthogonal pair of HTS coils.
Figure 4C:
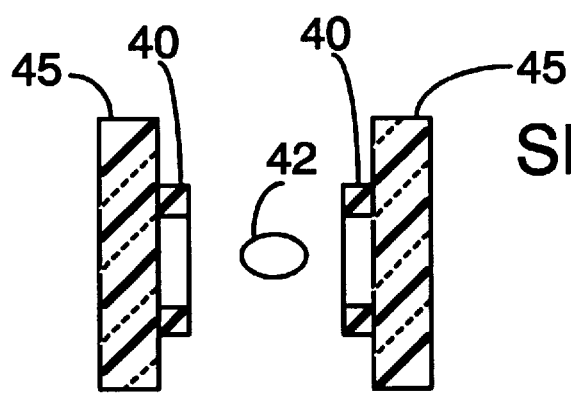

With reference to FIG. 4a, a pair of prior art planar HTS probe coils 40, forming a Helmholtz coil pair, is shown disposed on opposite sides of a cylindrical sample 42. FIG. 4c shows the substrate supporting coils 40, but in all other drawings the substrate is not shown and is assumed. With reference to FIG. 4b, a second pair of HTS coils 44, is shown disposed orthogonally to the first pair 40 to provide for simultaneous multifrequency excitation. The orthogonal disposition of the coil pairs minimizes their mutual coupling. These coils are excited by coupling to a loop antenna 41" which is connected by a transmission line 41 to an rf source. The coupling antenna for the second coil pair 44 is not shown.

Figure 5A:
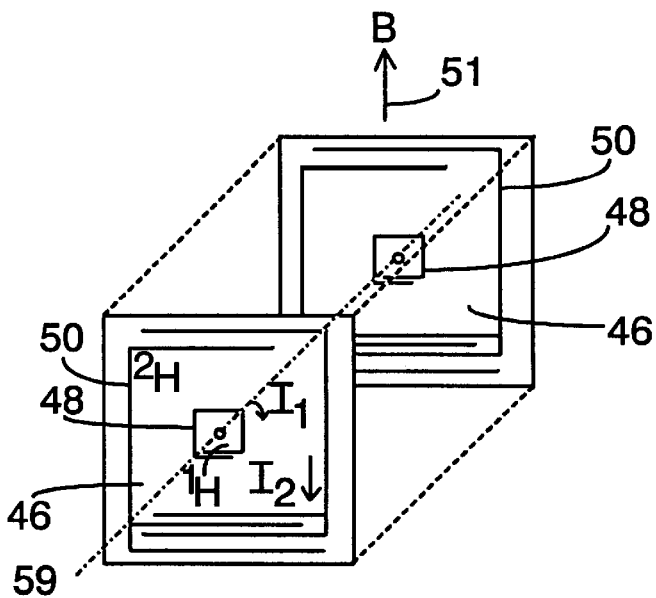
FIG. 5a is a schematic drawing of two nested HTS coil pairs with common axes of symmetry according to the invention.

With reference to FIG. 5a, an embodiment of our invention is shown having two sets 46 of nested substantially coplanar HTS proton ($^1$H) coils 48 and deuterium ($^2$H) field-frequency lock coils 50. Each set is preferably mounted on a single substrate (not illustrated) The two sets of coils are positioned on opposite sides of the normally cylindrical sample (not shown), the long axis of the sample being disposed in the direction of $B_o$, the static magnetic field 51. Each pair of coils is excited by loop antennae which are not shown to avoid clutter but are assumed.

Figure 5B:
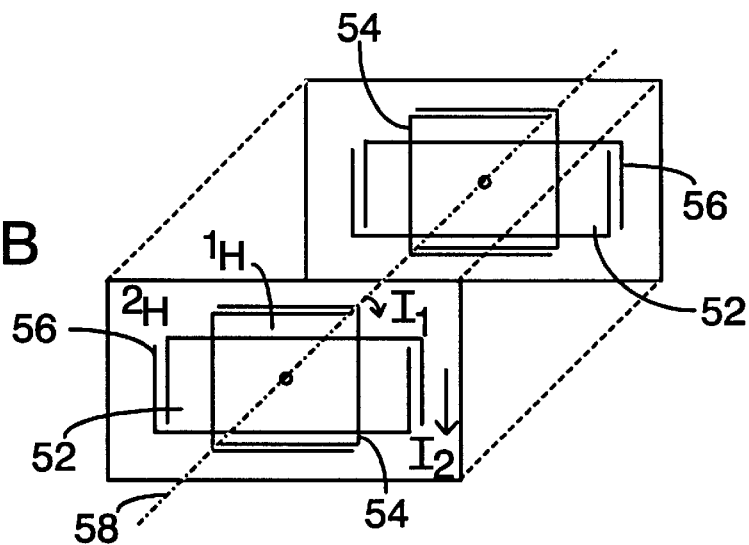
FIG. 5b is a schematic drawing of two overlapping HTS coil pairs with common axes of symmetry according to the invention.

With reference to FIG. 5b, another embodiment of our invention is shown having two sets 52 of overlapping substantially coplanar HTS proton ($^1$H) coils 54 and deuterium ($^2$H) field-frequency lock coils 56. The two sets of coils are positioned on opposite sides of the normally cylindrical sample (not shown), the long axis of the sample being disposed in the direction of the magnetic field 51.

Figure 5C:
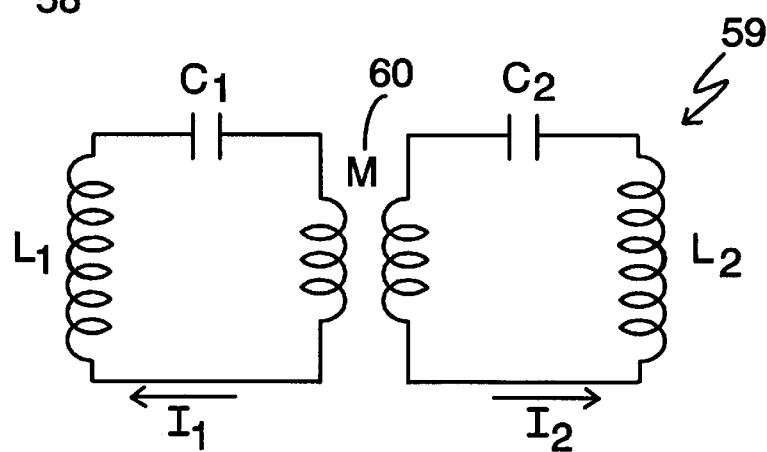
FIG. 5c is the equivalent circuit of the coil pairs of FIGS. 5a and 5b.

Similar coils on opposite sides of the sample constitute a coil pair. The nested coil pairs 48, 50 have a common axis of symmetry 57 which passes through the center of the sample. Similarly the overlapping coil pairs 54,56 have a common axis of symmetry 58 which passes through the center of the sample. As a practical matter, the nested coils 48,50 are more easily fabricated from single HTS films than the overlapping coils 54,56. The latter requires two electrically isolated films deposited on separate thin substrates or alternatively separate films deposited on opposite sides of a single substrate. The equivalent circuit 59 applicable to both the nested coils 48,50 and the overlapping coils 54,56 is shown in FIG. 5c. Mutual inductance 60 between the coil pairs needs to be made as small as possible to minimize both the ratio of currents $I_2/I_1$ when at the proton frequency and the ratio of currents $I_1/I_2$ when at the field-frequency lock frequency.

Small mutual inductance is achieved by the placement of the conductors of the two coils. The mutual inductance between two coils can be obtained from the equation $$M = \frac{\mu}{4\pi} \oint \oint \frac{\cos\theta ds_1 d s_2}{r}$$

where $\mu$ is the permittivity of free space ($4\pi \times 10^{-7}$ H/m), $ds_1$, and $ds_2$ increments along the conductors of coils 1 and 2 respectively, r the distance between $ds_1$, and $\theta$ is and 6 is the angle between the two increments. The double integral is taken along the path of each conductor. From this formula one observes that there is no contribution to the mutual inductance from regions where $ds_1$ and $ds_2$ are perpendicular to each other, and the mutual inductance is minimized by keeping regions where the two conductors are parallel as far from each other as possible. Thus by centering the small coil of FIG. 5a within the larger coil one reduces their mutual inductance. In FIG. 5b the two coils can be made with comparable self inductance, however by spacing the coil sections where the conductors are parallel the mutual inductance between them is minimized.

An analysis of the equivalent circuit 59 gives resonant frequencies of $$\omega_{high}^2 = \omega_1^2 \{1 + \alpha^2 / [N(P-1)]\} / (1\alpha^2/N)$$

$$\omega_{low}^2 = 107 \,_2^2 \{1 - P\alpha^2/[N(P-1)]\}/(1-\alpha^2/N)$$

where $\omega_1^2 = 1/(L_1 C_1)$, $\omega_2^2 = 1(L_2 C_2)$, $\alpha = M/L_1$, $N = L_2/L_1$, and $P = L_2 C_2/L_1 C_1$. We assume that P>>1, [For deuterium, P=1/$(0.1535)^2 = 42.4$], and that $\alpha^2/N < 1$.

At the proton frequency the ratio of currents in the deuterium coil 50, 56 to that in the proton coil 48, 54 is $$I_2/I_1 = -(\alpha/N)[P/(P-1)] \approx -\alpha/N = -M/L_2 \text{ for deuterium}$$

At the field-frequency lock frequency, the ratio of currents in the proton coil to that in the deuterium coil is $$I_1/I_2 = \alpha/(P-1) = (M/L_1)/(P-1)$$

For the nested coils of FIG. 5a, values of $(M/L_1) = 0.5$ to 0.6 are achievable, and if the inductance $L_2$ of field-frequency lock coil 50 is made three times the inductance $L_1$ of proton coil 48, then $M/L_2 \approx \frac{1}{6}$. Under these conditions the current ratios $I_2/I_1$ and $I_1/I_2$ in the aforementioned equations would be acceptable for some applications.

Figure 6A:
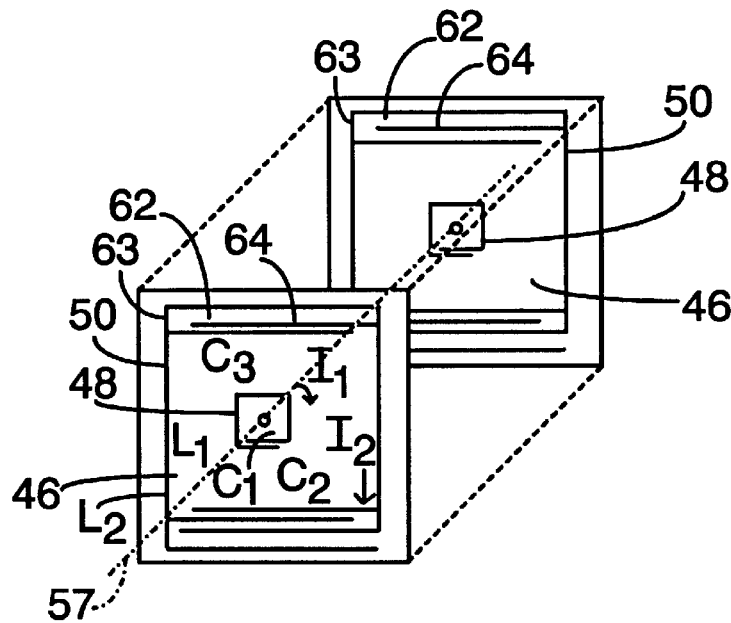
FIG. 6a is a schematic drawing of two nested coil pairs with an LC trap in one according to the invention.
Figure 6B:
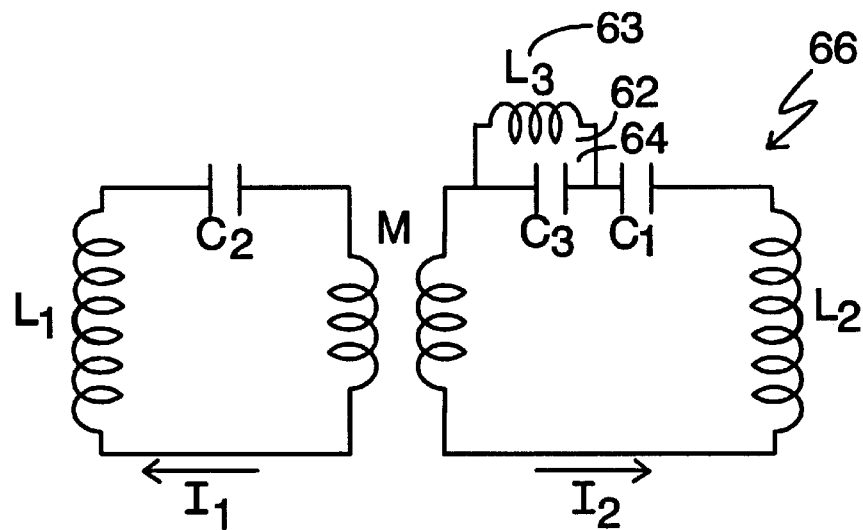

With reference to FIG. 6a, an LC trap 62 at the proton frequency could be added to the field-frequency lock coil 50 by bridging part of its inductance 63 with a capacitor 64 to further reduce the lock current at the proton frequency. FIG. 6b shows the modified equivalent circuit 66 with the addition of the trap 62. The trap 62 reduces the lock current at the proton frequency by a factor $\beta = (L_3/L_2)/(1-\omega^2 L_3 C_3)$. The trap in effect increases the inductance of the lock coil from $L_2$ to $(\beta+1) L_2$ at the proton frequency. The trap 62 is most effective when its resonant frequency is the same as the proton frequency, but it has a substantial impedance even when its resonance is slightly off the proton frequency. With the trap resonance 0.5% above the proton frequency, $\beta = 100 L_3/L_2$ and with $L_3 = L_2/4$ by way of example, the lock current is reduced by a factor of 25.

As heretofore described, the nested HTS coil pairs 48,50 and the overlapping HTS coil pairs 54,56 have common axes of symmetry 57,58 respectively, which axis are positioned to pass through the center of the sample (not shown) in the space between the coils. The fields produced by the coil pairs 48,50 have the same symmetry axis 57 and the fields produced by the coil pairs 54,56 have the same symmetry axis 58. Although each of the two sets of nested coils 46 and overlapping coils 52 may be mounted on individual close spaced thin substrates there is no way in these embodiments of the invention to reduce the mutual inductance of the coil pairs to zero without destroying their symmetry axes after the individual coils are made.

Figure 7:
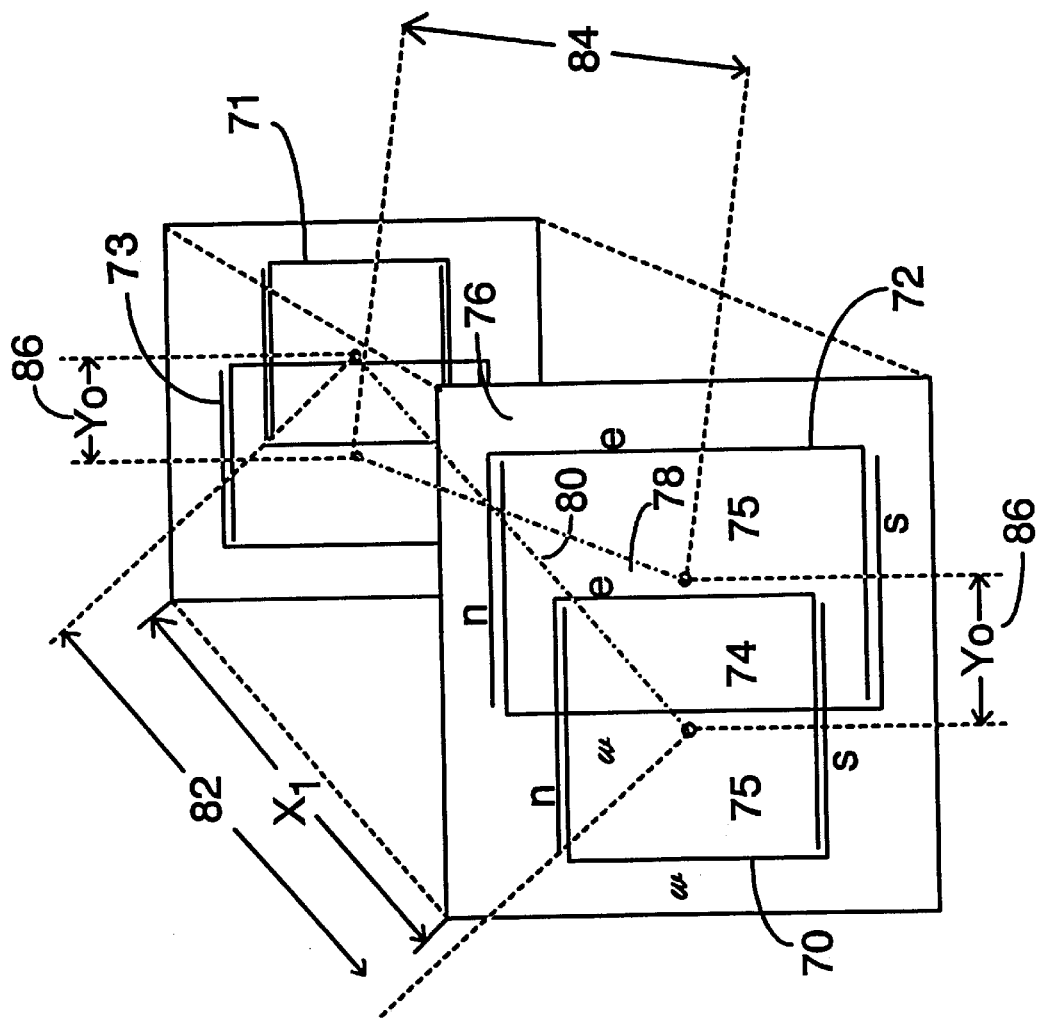
FIG. 7 is a schematic drawing of two overlapping coil pairs with non common axes of symmetry according to the invention.

With reference to FIG. 7, another embodiment of the invention is shown which overcomes the aforementioned problem. The two coils 70, 72 are configured to have overlapping region 74 and non overlapping regions 75 like the coils 54,56 in FIG. 5b. However in this alternative the symmetry axes 76, 78 of coil pairs 70, 72 respectively are not coaxial but instead their axes intersect at the center 80 of the sample region (sample not shown). By adjusting the distances 82, 84 that separate the planes of each coil from its mate, and the coil spacing 86 between the symmetry axes of coils on each side of the sample region, it can be shown that a net mutual coupling near zero can be obtained.

The mutual inductance between coils 70 and 72 can be analyzed by considering separately the mutual inductance between each wire segment of coil 70 with each wire segment of coil 72. To illustrate this the four segments of each coil are lab-led by the letters n, e, s, and w (north, east, south, and west) as indicated in FIG. 7. Since segments labeled n and s are perpendicular to segments labeled e and w there is no contribution to the mutual inductance from these pairs. Specifically there is no mutual inductance between the following pairs: 70n and 72e or 72w; 70e and 72n or 72s; 70s and 72e or 72w; 70w and 72s.

In summing the mutual inductance from the remaining coil segment pairs the relative signs of the various contributions must be considered. This is easily done by considering the direction of the conductors in each coil to have the same sense of rotation. The direction of the coil segments of FIG. 7 is taken as clockwise. The coils are symmetric to a reflection in the Z=0, i.e. the horizontal plane. With these conditions the mutual inductance contribution between segments 70n and 72n is equal to the contribution between 70s and 72s and is positive. The contribution by 70n and 72s is equal to the contribution by 70s and 72n and is small and negative. The contribution by 70e and 72e and by 70w and 72w are positive and large when the horizontal coil spacing, $Y_0$ is small and the contribution rapidly decreases with increasing spacing. The contribution by 70w and 72e is generally small and negative. The contribution by 70e and $72w$ is small and negative for small horizontal coil spacing $Y_0$, and becomes large and negative as these two conductors approach each other. By selecting the spacing $Y_0$ between these coils and therefore the spacing between the two conductors $70e$ and $72w$, the total mutual inductance can be made positive, zero or negative.

If the measurements of the lengths and spacing of the conductors are made in units of centimeters (cm) and the mutual inductance M expressed in units of nanoHenrys (nH), the formula for the mutual inductance takes the form $$M = \oint \oint \frac{\cos\theta ds_1 d s_2}{r} \text{ nH}$$

Figure 8:
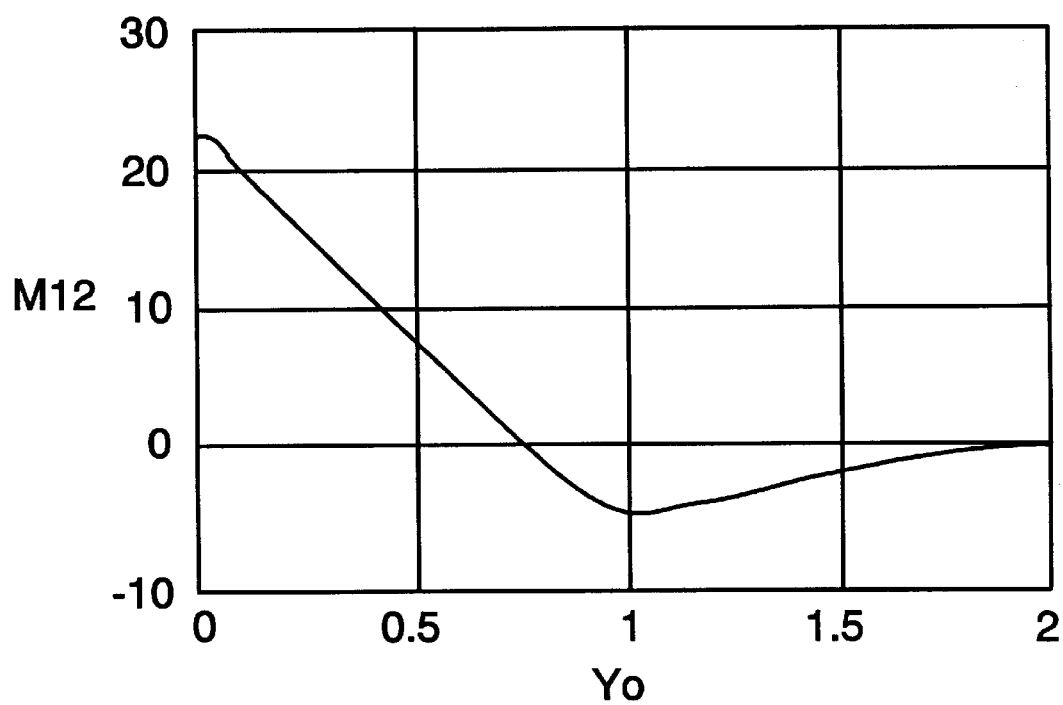
FIG. 8 is a graph of mutual inductance vs. coil spacing.

By way of example the double integral has been analyzed for two coils shown in FIG. 7 with the following dimensions: Lengths $70e=70w=72e=72w=2$ cm. Lengths $70n=70s=72n=72s=1$ cm. Spacing between the planes of the two coils $X_0=0.1$ cm. The distance between the coil centers $=Y_0$. FIG. 8 shows the relative value of mutual inductance as a function of $Y_0$. With these dimensions the mutual inductance goes from positive for values of $Y_0$ less than approximately 0.82 cm. to negative for values of $Y_0$ larger than approximately 0.82 cm. The mutual inductance is near zero at $Y_0=0.82$ cm.

The contribution to mutual inductance of the coil pair 71 and 73 on the other side of the crossover point 80 of FIG. 7 must also be considered. Since these coils are identical to coils 70 and 72, the mutual inductance between them will also change in the same way with spacing $Y_0$ Coils 70 and 71 are tuned to the same frequency and have essentially the same electrical current. Coils 72 and 73 are also tuned to the same frequency, but a different frequency from that of coils 70 and 71. The mutual coupling between segments of coil 70 and coil 73 must be considered. The spacing between coils 70 and 73 is largely independent of $Y_0$ and depends only on the distance $X_1$ between the planes containing coils 70 and 73.

Figure 9:
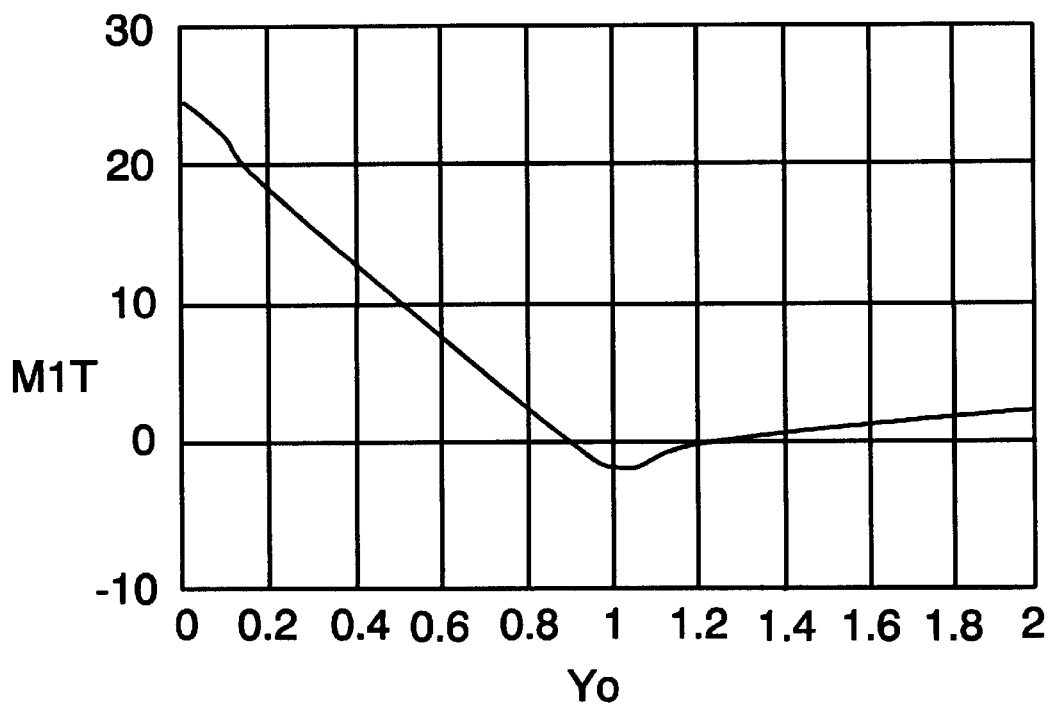
FIG. 9 is a graph of total mutual inductance vs. coil spacing.

In this example the distance $X_1$ between the planes containing coils 70 and 73 is chosen to be 1 cm. Carrying out the analysis for the mutual inductance between coils 70 and 73 gives a value of 2.56 nH. Adding this value to the mutual coupling between coils 70 and 72 yields the total mutual coupling of coil 70 to the two coils 72 and 73. FIG. 9 is a graph showing the total mutual inductance between coil 70 and the combination of coils 72 and 73 vs. $Y_0$. By symmetry the total mutual inductance between coil 71 and the combination of coils 72 and 73 is the same as that of coil 70. As noted from FIG. 9 the total mutual inductance is approximately zero when $Y_0=0.91$ cm.

Figure 7A:
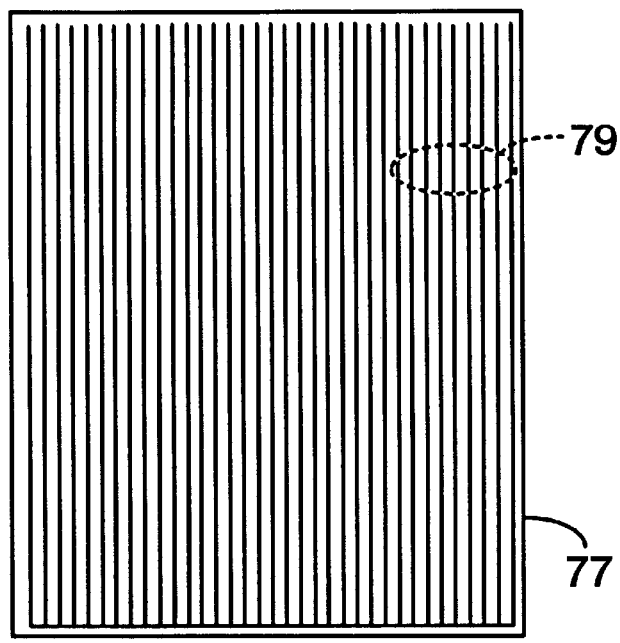
FIG. 7a is a schematic drawing of a Faraday shield according to the invention.
Figure 7B:
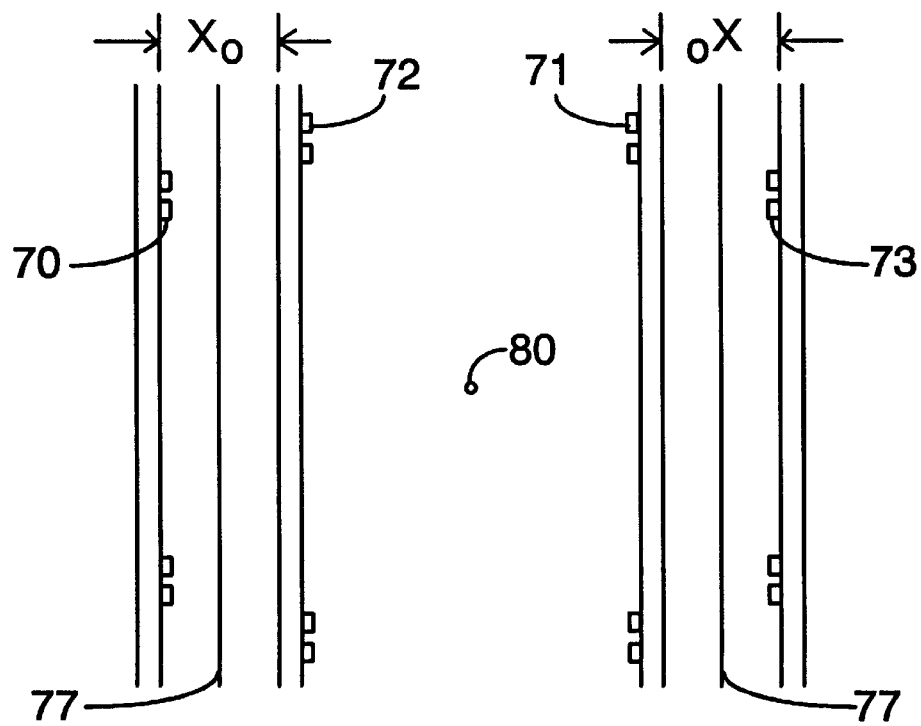
FIG. 7b is a schematic drawing showing Faraday shields positioned between coils according to the invention.

Making the total mutual inductance between coils 70 and 71 and the combination of coils 72 and 73 zero, insures that currents in the coil pair 70, 71 do not induce currents into coils 70 and 73. However there may also be electric fields due to the voltages on these coils and any residual capacitive coupling between the coil pairs may cause undesired coupling. It is well known that capacitive coupling between coils can be greatly reduced or eliminated by the use of a Faraday shield. In this case a Faraday shield 77 can be made of a number of parallel conductors 79 that are electrically connected at one end as illustrated in FIG. 7a. The conductors may be fabricated from HTS materials in the same manner that coils are fabricated. Shields 77 can then be placed between coils 70 and 72 and between coils 71 and 73 as illustrated in FIG. 7b.

Figure 10:
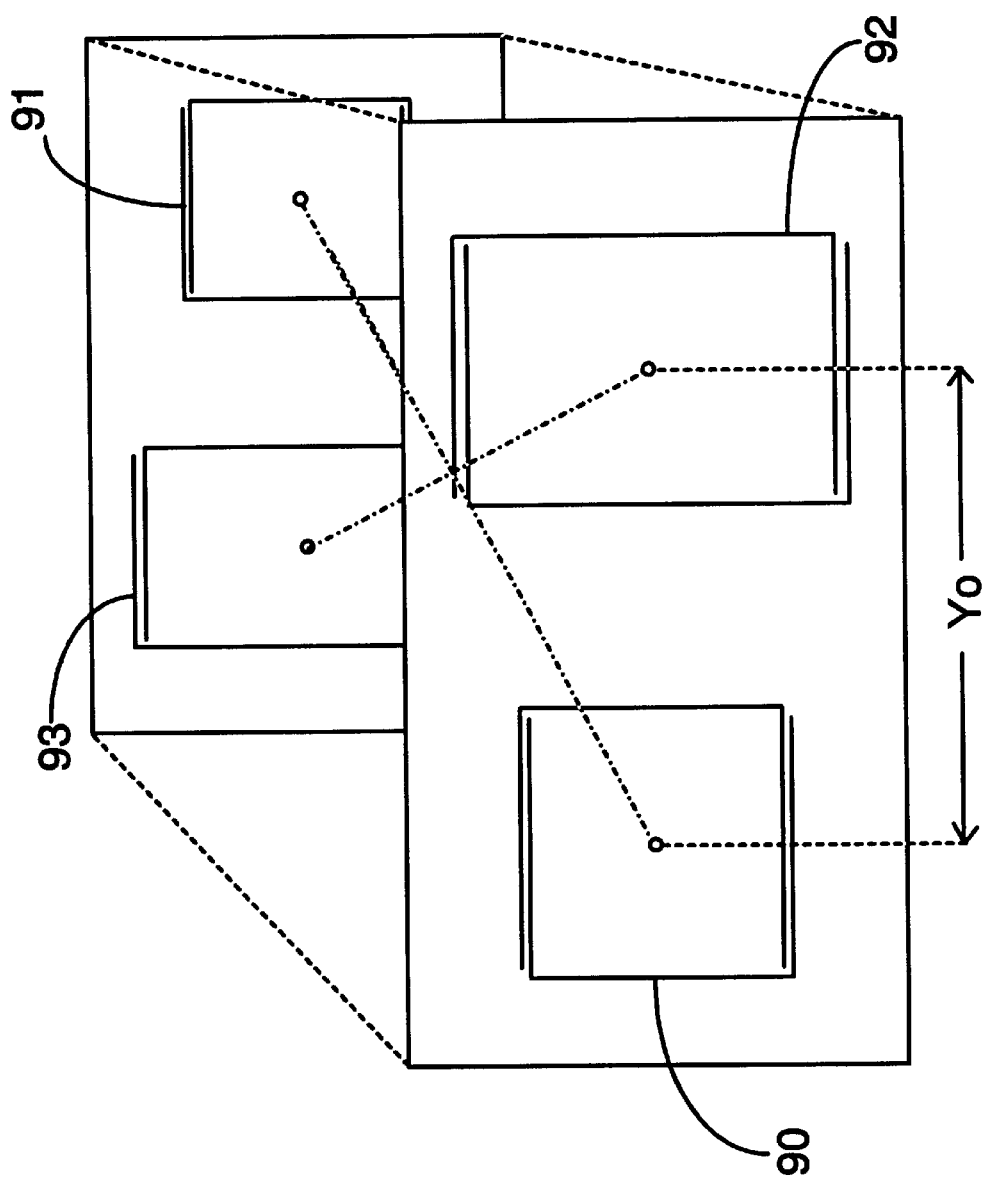
FIG. 10 is a schematic drawing of two non-overlapping coil pairs with non common axes of symmetry according to the invention.

As noted in FIG. 9 there is another value of $Y_0$ that leads to zero total mutual coupling to coil 70 from the two coils 72 and 73. In this example the other value of $Y_0$ that gives zero total mutual coupling is approximately 1.24 cm. In this case, using the value of 1.24 cm. for $Y_0$ there is no overlap of the coil conductors, permitting the coils to be in the same plane as shown in FIG. 10. However with the coils in the same plane, i.e. $X_0=0$ instead of $X_0=0.1$ cm. as in the above example, but with all other coil dimensions the same, the values of mutual inductances between coil segments change slightly requiring therefore a slightly different value of $Y_0$ to yield zero total mutual coupling. Repeating, the analysis with $X_0=0$ but with all other dimensions the same yields a total mutual inductance of approximately zero when $Y_0=1.265$. The coils 90 and 92 of FIG. 10 are in one plane and therefore both coils can be fabricated on one side of a single substrate. Their mating coils, 91 and 93, can similarly be fabricated on one side of a second substrate. As the graph of FIG. 8 indicates, the mutual inductance between coils 90 and 92 of FIG. 10 is negative whereas the mutual inductance between coils 90 and 93 of FIG. 10 is positive, the sum of the two therefore yielding a total mutual coupling of zero when $Y_0=1.265$.

Figure 11:
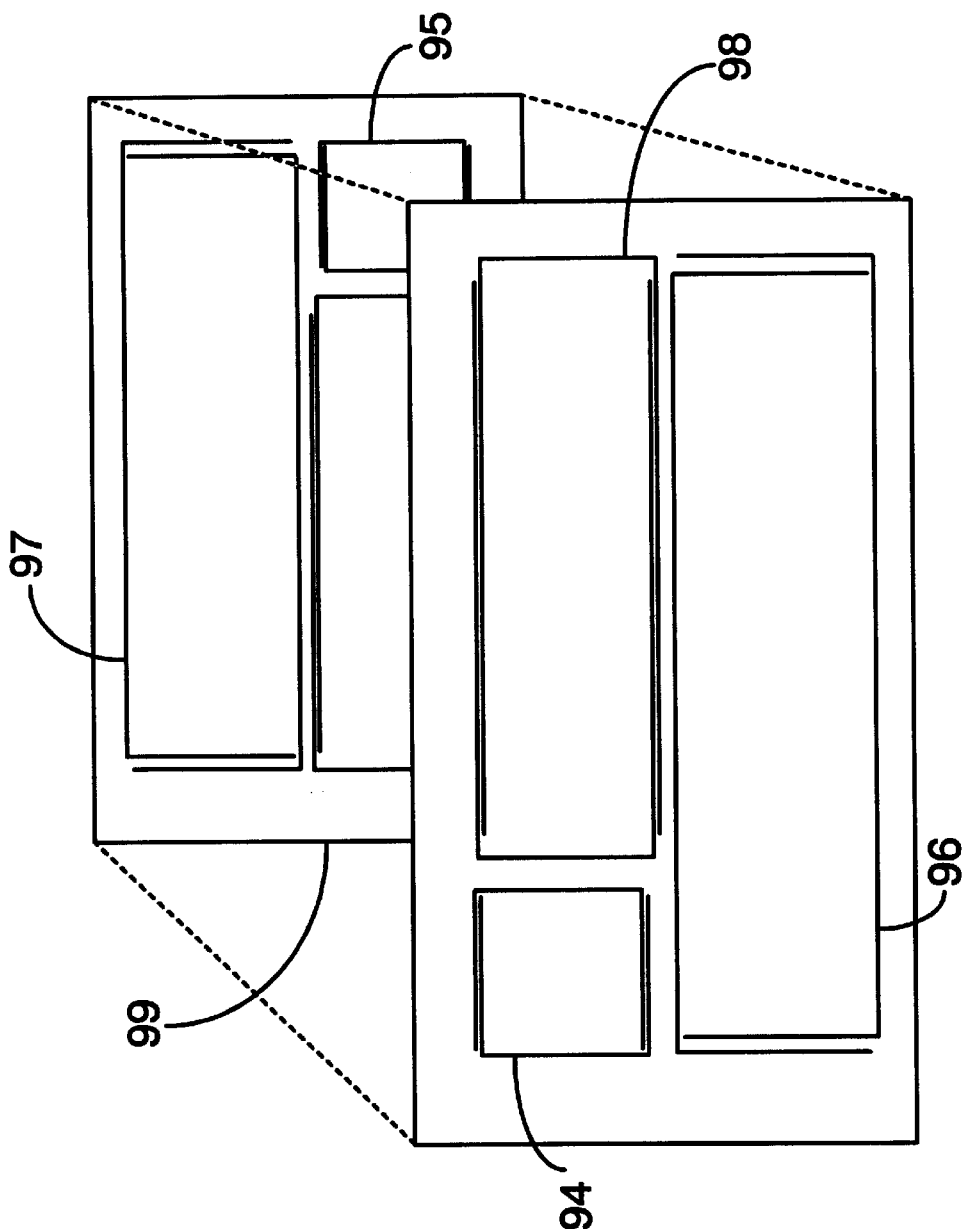
FIG. 11 is a schematic drawing of three non-overlapping coil pairs with non common axes of symmetry according to the invention.

With reference to FIG. 11, the coil arrangement of FIG. 10 may be extended to 3 coil pairs 94 and 95, 96 and 97, 98 and 99. This arrangement may be particularly useful in 2D or 3D experiments where short high power pulses are applied to determine molecular structure or molecular confirmation. The coil pair 96 and 97 may be made of HTS materials to provide high sensitivity for receiving the weak NMR responses, and the coil pairs 94 and 95, 98 and 99, may be made of copper or other normal conductors to provide the high power pulses. With this coil arrangement a near zero coupling condition of the coil pairs 94 and 95, 98 and 99 from the coil pair 96 and 97 may be obtained. Coupling between the two coil pairs 94 and 95, 98 and 99 may be of no consequence. Coil pairs 94 and 95, 98 and 99 may be placed on planes somewhat farther from the sample region than the coil pair 96 and 97, and if desired Faraday shields may be appropriately placed on separate planes between them to reduce or eliminate capacitive coupling as previously described and illustrated in FIGS. 7a and 7b for the case of two overlapping coils. As in the aforementioned case the Faraday shield may be made of HTS material to minimize rf losses. In this multiple coil arrangement the coils may be in different planes and may or may not be overlapping. The multiple coil arrangement with overlapping coils is not shown.

Although specific HTS coil shapes and aspect ratios and only simple resonant circuit configurations are used herein for illustrative purposes, it is not intended that the invention be restricted to them but rather that it be applicable to all HTS planar thin film coil structures. Although specific applications utilizing multifrequency excitation are cited including field-frequency lock and spin-spin decoupling, it is not intended that the invention be restricted to these applications but rather that it be applicable to all applications utilizing multifrequency excitation. Also, though reference herein is limited to $^1H$, $^2H$, and $^{13}C$ nuclei, it is not intended that the invention be restricted to them but rather that it be applicable to other spin active nuclei as well, particularly including important nuclei such as $^{14}N$, $^{15}N$, $^{19}F$, $^{31}P$ and $^{35}Cl$. In accordance with these considerations the scope of the invention should be (construed in view of our claims.

What is claimed is:

1. In a nuclear magnetic resonance (NMR) probe having a plurality of coil pairs for exciting multiple resonances and detecting NMR responses, the improvement comprising, each of said coil pairs having a first planar coil and a second planar coil, all of said first planar coils being disposed substantially parallel to one another, and all of said second planar coils being disposed substantially parallel to one another, at least on of said coil pairs being made from an HTS material and said first and second planar coils having no point of direct electrical contact.

2. A nuclear magnetic resonance probe comprising, a holder for holding an NMR sample and for positioning said sample in a sample space in a static magnetic field, said sample space having first and second opposing sides and a center;

two coil pairs, each said coil pair being affixed to said probe, each said coil pair having a first planar coil and a second planar coil, each said first planar coil being positioned proximate to said first side of said sample space, each said second planar coil being positioned proximate to said second side of said sample space, each said planar coil having a center of symmetry;

said first planar coils of said two coil pairs being a substantially coplanar first coil set and said second planar coils of said two coil pairs being a substantially coplanar second coil set;

said coplanar first coil set and said coplanar second coil set being substantially parallel and defining a sample axis therebetween, said sample axis parallel in common with both said coplanar coil sets;

said first planar coil and said second planar coil of each of said two coil pairs defining a magnetic field therefrom when excited, each of said coil pairs defining an axis of symmetry, said coils being positioned so that each of said axes of symmetry passes through said center of said sample space and the major component of each said magnetic field is orthogonal to said sample axis and parallel to one another.

3. The NMR probe of claim 2, wherein one or more Faraday shields are affixed to said probe.

4. The NMR probe of claim 3, wherein two Faraday shields are affixed to said probe, one of said shields being positioned between said planar coils proximate to said first side of said sample space, the other said shield being positioned between said planar coils proximate to said second side of said sample space.

5. The NMR probe of claim 2, wherein at least one of said coil pairs is an HTS coil pair.

6. The NMR probe of claim 5, wherein said axis of symmetry of each of said magnetic fields defined by said first coil pair and said second coil pair are common collinear axes.

7. The NMR probe of claim 6, wherein said first coil pair and said second coil pair are nested HTS coil pairs.

8. The NMR probe of claim 7, wherein said first planar coils of said first coil pair and said second coil pair are made from a single thin film deposited on one side of a first substrate, and said second planar coils of said first coil pair and said second coil pair are made from a thin film deposited on one side of a second substrate.

9. The NMR probe of claim 8, wherein one of said coil pairs is a proton ($^1$H) coil pair and the other said coil pair is tuned for a different NMR nucleus.

10. The NMR probe of claim 9, wherein said different NMR nucleus is chosen from a group consisting of $^2$H, $^{31}$P, $^{13}$C, $^{14}$N, $^{15}$N, $^{19}$F and $^{35}$Cl.

11. The NMR probe of claim 10, wherein the other said coil pair is a field-frequency lock coil pair and said different NMR nucleus is deuterium ($^2$H).

12. The NMR probe of claim 11, wherein the deuterium field-frequency lock coil pair includes an LC trap.

13. The NMR probe of claim 12, wherein said HTS films are YBa$_2$Cu$_3$O$_{7-\delta}$ and said first and second substrate materials are selected from the group consisting of sapphire, lanthanum aluminate and magnesium oxide.

14. The NMR probe of claim 6, wherein said first coil pair and said second coil pair are overlapping HTS coil pairs.

15. The NMR probe of claim 14, wherein said first planar coils of said first coil pair and said second coil pair are made from thin films deposited on opposite sides of a first substrate, and said second planar coils of said first coil pair and said second coil pair are made from thin films deposited on opposite sides of a second substrate.

16. The NMR probe of claim 15, wherein one of said coil pairs is a proton ($^1$H)coil pair and the other said coil pair is tuned for a different NMR nucleus.

17. The NMR probe of claim 16, wherein said different NMR nucleus is chosen from a group consisting of $^2$H, $^{31}$P, $^{13}$C, $^{14}$N, $^{15}$N, $^{19}$F and $^{35}$Cl.

18. The NMR probe of claim 17, wherein the other said coil pair is a field-frequency lock coil pair and said different NMR nucleus is deuterium ($^2$H).

19. The NM probe of claim 18, wherein the deuterium field-frequency) lock coil pair includes an LC trap.

20. The NMR probe of claim 19, wherein said HTS films are YBa$_2$Cu$_3$O$_{7-\delta}$ and said first and second substrate materials are selected from the group consisting of sapphire, lanthanum aluminate and magnesium oxide.

21. The NMR probe of claim 14, wherein said first planar coil of said first coil pair is a thin film deposited on a first substrate, and said first planar coil of said second coil pair is a thin film deposited on a second substrate, and said second planar coil of said first coil pair is a thin film deposited on a third substrate, and said second planar coil of said second coil pair is a thin film deposited on a fourth substrate.

22. The NMR probe of claim 21, wherein one of said coil pairs is a proton ($^1$H) coil pair and the other said coil pair is tuned for a different NMR nucleus.

23. The NMR probe of claim 22, wherein said different NMR nucleus is chosen from a group consisting of $^2$H, $^{31}$P, $^{13}$C, $^{14}$N, $^{15}$N, $^{19}$F and $^{35}$Cl.

24. The NMR probe of claim 23, wherein the other said coil pair is a field-frequency lock coil pair and said different NMR nucleus is deuterium ($^2$H).

25. The NMR probe of claim 24, wherein the deuterium field-frequency lock coil pair includes an LC trap.

26. The NMR probe of claim 25, wherein said HTS films are YBa$_2$Cu$_3$O$_{7-\delta}$ and said first, second, third, and fourth substrate materials are selected from the group consisting of sapphire, lanthanum aluminate and magnesium oxide.

27. The NMR probe of claim 21, wherein a first Faraday shield is positioned between said first planar coil of said first coil pair and said first planar coil of said second coil pair, and wherein a second Faraday shield is positioned between said second planar coil of said first coil pair and said second planar coil of said second coil pair.

28. The NMR probe of claim 27, wherein one of said coil pairs is a portion ($^1$H) coil pair and the other said coil pair is tuned for a different NMR nucleus.

29. The NMR probe of claim 28, wherein said different NMR nucleus is chosen from a group consisting of $^2$H, $^{31}$P, $^{13}$C, $^{14}$N, $^{15}$N, $^{19}$F and $^{35}$Cl.

30. The NMR probe of claim 29, wherein the other said coil pair is a field-frequency lock coil pair and said different NMR nucleus is deuterium ($^2$H).

31. The NMR probe of claim 30, wherein the deuterium field-frequency lock coil pair includes an LC trap.

32. The NMR probe of claim 31, wherein said HTS films are $YBa_2Cu_3O_{7-\delta}$ and said first, second, third, and fourth substrate materials are selected from the group consisting of sapphire, lanthanum aluminate and magnesium oxide.

33. The NMR probe of claim 5, wherein said axis of symmetry of said magnetic field defined by said first planar coil pair is angularly displaced from said axis of symmetry of said magnetic field defined by said second coil pair.

34. The NMR probe of claim 33, wherein said first coil pair and said second coil pair are non-overlapping HTS coil pairs.

35. The NMR probe of claim 34, wherein said first planar coils of said first coil pair and said second coil pair are made from a single thin film deposited on one side of a first substrate, and said second planar coils of said first coil pair and said second coil pair are made from a thin film deposited on one side of a second substrate.

36. The NMR probe of claim 35, wherein one of said coil pairs is a proton ($^1H$) coil pair and the other said coil pair is tuned for a different NMR nucleus.

37. The NMR probe of claim 36, wherein said different NMR nucleus is chosen from a group consisting of $^2H$, $^{31}P$, $^{13}C$, $^{14}N$, $^{15}N$, $^{19}F$ and $^{35}Cl$.

38. The NMR probe of claim 37, wherein the other said coil pair is a field-frequency lock coil pair and said different NMR nucleus is deuterium ($^2H$).

39. The NMR probe of claim 38, wherein the deuterium field-frequency lock coil pair includes an LC trap.

40. The NMR probe of claim 39, wherein said HTS films are $YBa_2Cu_3O_{7-\delta}$ and said first and second substrate materials are selected from the group consisting of sapphire, lanthanum aluminate and magnesium oxide.

41. The NMR probe of claim 33, wherein said first coil pair and said second coil pair are overlapping HTS coil pairs.

42. The NMR probe of claim 41, wherein said first planar coils of said first coil pair and said second coil pair are made from thin films deposited on opposite sides of a first substrate, and said second planar coils of said first coil pair and said second coil pair are made from thin films deposited on opposite sides of a second substrate.

43. The NMR probe of claim 42, wherein one of said coil pairs is a proton ($^1H$) coil pair and the other said coil pair is tuned for a different NMR nucleus.

44. The NMR probe of claim 43, wherein said different NMR nucleus is chosen from a group consisting of $^2H$, $^{31}P$, $^{13}C$, $^{14}N$, $^{15}N$, $^{19}F$ and $^{35}Cl$.

45. The NMR probe of claim 44, wherein the other said coil pair is a field-frequency lock coil pair and said different NMR nucleus is deuterium ($^2H$).

46. The NMR probe of claim 45, wherein the deuterium field-frequency lock coil pair includes an LC trap.

47. The NMR probe of claim 46, wherein said HTS films are $YBa_2Cu_3O_{7-\delta}$ and said first and second substrate materials are selected from the group consisting of sapphire, lanthanum aluminate and magnesium oxide.

48. The NMR probe of claim 41, wherein said first planar coil of said first coil pair is a thin film deposited on a first substrate, and said first planar coil of said second coil pair is a thin film deposited on a second substrate, and said second planar coil of said first coil pair is a thin film deposited on a third substrate, and said second planar coil of said second coil pair is a thin film deposited on a fourth substrate.

49. The NMR probe of claim 48, wherein one of said coil pairs is a proton ($^1H$) coil pair and the other said coil pair is tuned for a different NMR nucleus.

50. The NMR probe of claim 49, wherein said different NMR nucleus is chosen from a group consisting of $^2H$, $^{31}P$, $^{13}C$, $^{14}N$, $^{15}N$, $^{19}F$ and $^{35}Cl$.

51. The NMR probe of claim 50, wherein the other said coil pair is a field-frequency lock coil pair and said different NMR nucleus is deuterium ($^2H$).

52. The NMR probe of claim 51, wherein the deuterium field-frequency lock coil pair includes an LC trap.

53. The NMR probe of claim 52, wherein said HTS films are $YBa_2Cu_3O_{7-\delta}$ and said first, second, third, and fourth substrate materials are selected from the group consisting of sapphire, lanthanum aluminate and magnesium oxide.

54. The NMR probe of claim 48, wherein a first Faraday shield is positioned between said first planar coil of said first coil pair and said first planar coil of said second coil pair, and wherein a second Faraday shield is positioned between said second planar coil of said first coil pair and said second planar coil of said second coil pair.

55. The NMR probe of claim 54, wherein one of said coil pairs is a proton ($^1H$) coil pair and the other said coil pair is tuned for a different NMR nucleus.

56. The NMR probe of claim 55, wherein said different NMR nucleus is chosen from a group consisting off $^2H$, $^{31}P$, $^{13}C$, $^{14}N$, $^{15}N$, $^{19}F$ and $^{35}Cl$.

57. The NMR probe of claim 56, wherein the other said coil pair is a field-frequency lock coil pair and said different NMR nucleus is deuterium ($^2H$).

58. The NMR probe of claim 57, wherein the deuterium field-frequency, lock coil pair includes an LC trap.

59. The NMR probe of claim 58, wherein said HTS films are $YBa_2CU_3O_{7-\delta}$ and said first, second, third, and fourth substrate materials are selected from the group consisting of sapphire, lanthanum aluminate and magnesium oxide.

60. A nuclear magnetic resonance probe comprising,
a holder for holding an NMR sample and for positioning said sample in a sample space in a static magnetic field, said sample space having first and second opposing sides and a center;
a plurality of coil pairs, each said coil pair being affixed to said probe, each said coil pair having a first planar coil and a second planar coil, each said first planar coil being positioned proximate to said first side of said sample space, each said second planar coil being positioned proximate to said second side of said sample space;
said first planar coils of each of said plurality of coil pairs being a substantially parallel first coil set and said second planar coils of each of said plurality of coil pairs being a substantially parallel second coil set, said parallel first coil set being substantially parallel to said parallel second coil set;
a magnetic field therefrom each of said magnetic fields defining a axis of symmetry said coils being a first axis extending from the center of said first planar coil of said first pair to the center of said second planar coil of said first pair, and a second axis and said first and second axes pass through extending from the center of said first planar coil of said second pair to the center of said second planar coil of said second pair, passes through said center of said sample space.

61. The NMR probe of claim 60, wherein said plurality of coil pairs is comprised of at least a first coil pair, a second coil pair and a third coil pair.

62. The NMR probe of claim 61, having three coil pairs wherein said second coil pair is an HTS coil pair.

63. The NMR probe of claim 62, wherein said first planar coil of said second coil pair is on a first plane and said first planar coils of said first coil pair and said third coil pair are on a second plane, said second plane being displaced from said first plane in a direction perpendicular to said first plane, and wherein said second planar coil of said second coil pair is on a third plane and said second planar coils of said first coil pair and said third coil pair are on a fourth plane, said fourth plane being displaced from said third plane in it direction perpendicular to said third plane.

64. The NMR probe of claim 63, wherein Faraday shields are interposed between said first plane and said second plane, and between said third plane and said fourth plane.

65. The NMR probe of claim 64, wherein said Faraday shields are made of HTS material.

66. The NMR probe of claim 60 wherein no coils comprising said first coplanar coils are directly electrically connected therebetween and no coils comprising said second coplanar coils are directly electrically connected therebetween.

67. The NMR probe of claim 60 wherein said first and second axes intersect at the center of said sample space.

* * * * *

UNITED STATES PATENT AND TRADEMARK OFFICE
CERTIFICATE OF CORRECTION

PATENT NO.    : 6,201,392 B1                                    Page 1 of 1
DATED         : March 13, 2001
INVENTOR(S)   : Anderson, et al.

It is certified that error appears in the above-identified patent and that said Letters Patent is hereby corrected as shown below:

<u>Title page,</u>
Please correct (75) Inventors: Luis Felipe Fuks to -- Luiz Felipe Fuks --

Signed and Sealed this

Twenty-eighth Day of August, 2001

Attest:

Attesting Officer

NICHOLAS P. GODICI
*Acting Director of the United States Patent and Trademark Office*